(12) United States Patent
Sultan et al.

(10) Patent No.: US 10,354,023 B1
(45) Date of Patent: Jul. 16, 2019

(54) TRANSFORMED FINITE ELEMENT MODELS FOR PERFORMING STRUCTURAL ANALYSIS

(71) Applicant: The Boeing Company, Chicago, IL (US)

(72) Inventors: Saif Sultan, Bothell, WA (US); Weidong Song, Woodinville, WA (US); Nooshin M. Khalili, Mukilteo, WA (US)

(73) Assignee: The Boeing Company, Chicago, IL (US)

( * ) Notice: Subject to any disclaimer, the term of this patent is extended or adjusted under 35 U.S.C. 154(b) by 1218 days.

(21) Appl. No.: 14/565,756

(22) Filed: Dec. 10, 2014

(51) Int. Cl.
*G06F 17/50* (2006.01)

(52) U.S. Cl.
CPC ...... *G06F 17/5004* (2013.01); *G06F 17/5018* (2013.01)

(58) Field of Classification Search
None
See application file for complete search history.

(56) References Cited

U.S. PATENT DOCUMENTS

| 5,884,232 A * | 3/1999 | Buder ............... G06F 17/5018 702/42 |
| 2004/0237420 A1* | 12/2004 | Zhang .................... G09B 25/04 52/79.1 |

OTHER PUBLICATIONS

Nagappan et al., "Joint Stiffness Optimization Techniques," SAE Aerospace Manufacturing and Automated Fastening Conference & Exhibition, Sep. 2010, 5 pages.

\* cited by examiner

*Primary Examiner* — Craig C Dorais
(74) *Attorney, Agent, or Firm* — Yee & Associates, P.C.

(57) ABSTRACT

A method and apparatus for transforming a finite element model is provided. A set of joint elements to the finite element model of a structure is created at a set of joint locations in the finite element model of the structure. A local coordinate system is assigned to each of the set of joint elements that is independent of a global coordinate system of the finite element model to generate a transformed finite element model. The transformed finite element model is generated with improved consistency and efficiency.

18 Claims, 9 Drawing Sheets

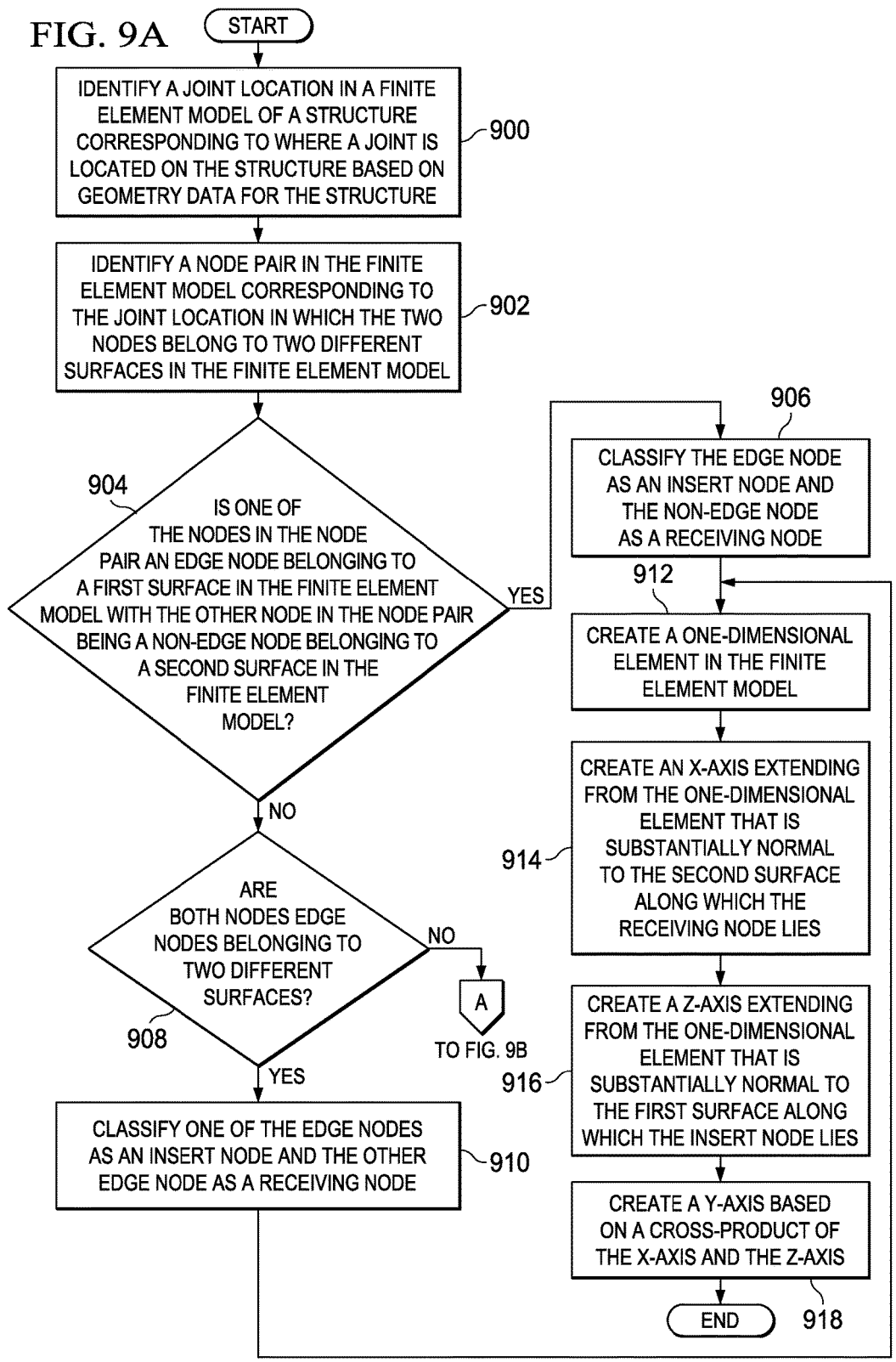

TRANSFORMED FINITE ELEMENT MODELS FOR PERFORMING STRUCTURAL ANALYSIS

BACKGROUND INFORMATION

1. Field

The present disclosure relates generally to finite element models and, in particular, to modifying finite element models. Still more particularly, the present disclosure relates to a method and apparatus for adding joint elements to finite element models with improved consistency and efficiency.

2. Background

Structural analysis includes determining the effects of loads on physical structures and the components of these physical structures. In some cases, structural analysis of a structure may be performed using a finite element model (FEM) of the structure. The finite element model may be a discretized model comprised of a set of finite elements interconnected at points called nodes. The finite elements in the model are non-overlapping components of simple geometry.

In some cases, a structural system may be comprised of one or more joints. Structural analysis may be used to identify, for example, without limitation, one or more margin of safety parameters for each of the joints in a structural system. For example, a tension margin of safety, a parallel shear margin of safety, a perpendicular shear margin of safety, a moment margin of safety, or some combination thereof may be identified for each of the joints in the structural system. This information may be identified by simulating the application of different types of loads on the structural system and determining the tension, parallel shear, perpendicular shear, moment, or combination thereof that would result at each joint in the structural system.

However, performing this type of analysis with the desired level of accuracy may require that a set of force axes be designated for each joint element in the finite element model representing a joint in the structural system. The set of force axes may include, for example, a tension axis, a parallel shear axis, and a perpendicular shear axis for each joint element. Tension may be measured along the tension axis. Parallel shear may be measured along the parallel shear axis. Perpendicular shear may be measured along the perpendicular shear axis. Moment may be measured about the perpendicular shear axis.

Currently available methods for creating joint elements in finite element models of structures and identifying a set of force axes for each of these joint elements may be more time-consuming and labor-intensive than desired. Further, in some cases, structural analysis performed using finite element models in which the identification of locations at which to create joint elements and the assignment of a set of force axes to each of these joint elements is performed manually may be less accurate than desired. Therefore, it would be desirable to have a method and apparatus that take into account at least some of the issues discussed above, as well as other possible issues.

SUMMARY

In one illustrative embodiment, an apparatus comprises a model transformer. The model transformer is configured to create a set of joint elements at a set of joint locations in a finite element model of a structure. The model transformer is further configured to assign a local coordinate system to each of the set of joint elements that is independent of a global coordinate system of the finite element model to generate a transformed finite element model. The model transformer generates the transformed finite element model with improved consistency and efficiency.

In another illustrative embodiment, a method for transforming a finite element model of a structure is provided. A set of joint elements to the finite element model of a structure is created at a set of joint locations in the finite element model. A local coordinate system is assigned to each of the set of joint elements that is independent of a global coordinate system of the finite element model to generate a transformed finite element model. The transformed finite element model is generated with improved consistency and efficiency.

In yet another illustrative embodiment, a method for transforming a finite element model of a structure is provided. A set of joints in the finite element model of the structure is identified. A set of joint elements is created at the set of joint locations in the finite element model. A local coordinate system is assigned to each of the set of joint elements that is independent of a global coordinate system of the finite element model to generate a transformed finite element model. The transformed finite element model is generated with improved consistency and efficiency as compared to when at least one of the set of joint elements is created manually or the local coordinate system for the each of the set of joint elements is assigned manually.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIGS. 9A and 9B are an illustration of a process for adding a joint element to a finite element model of a structure in the form of a flowchart in accordance with an illustrative embodiment.

DETAILED DESCRIPTION

Figure 1:
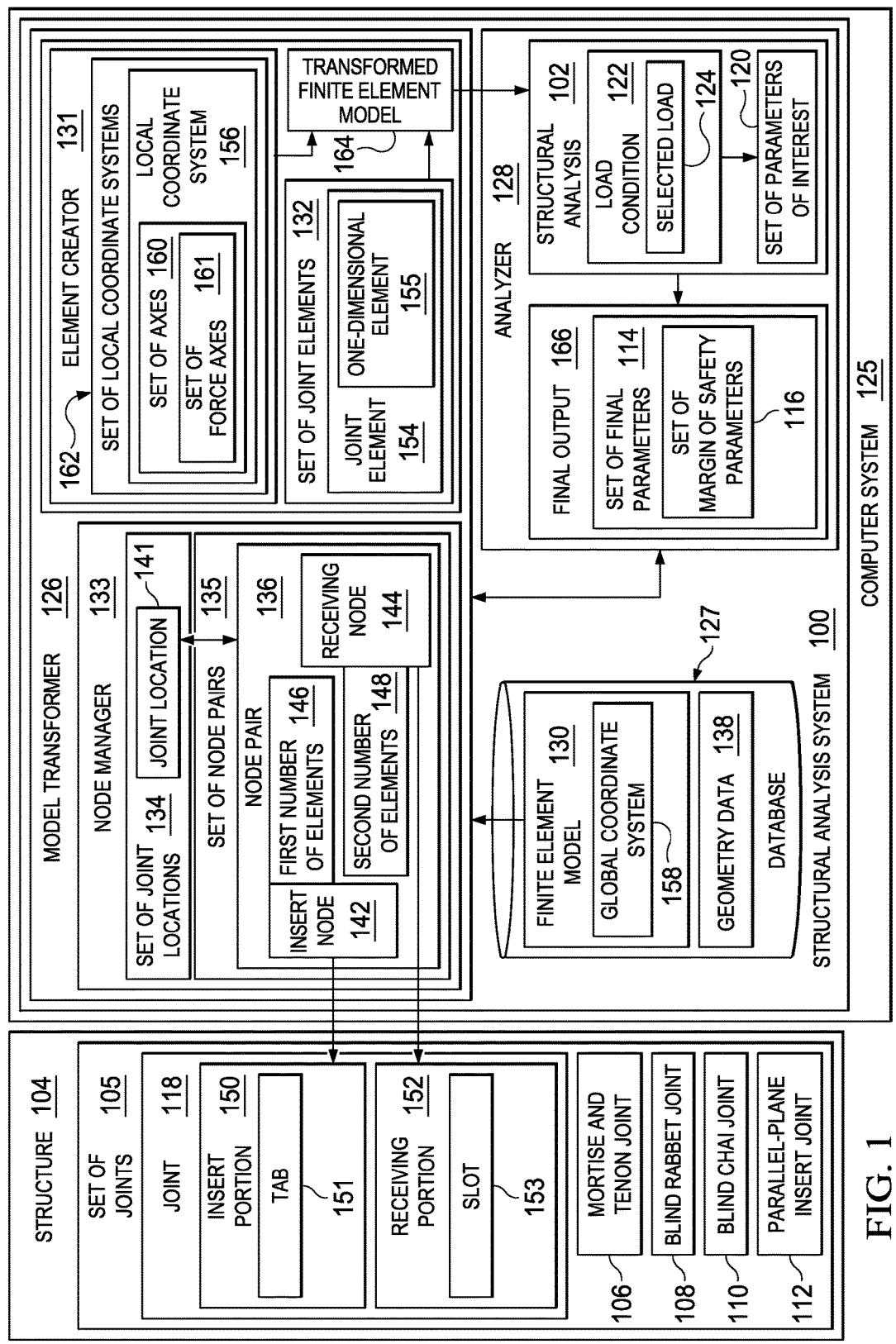
FIG. 1 is an illustration of a structural analysis system in the form of a block diagram in accordance with an illustrative embodiment.

Referring now to the figures and, in particular, with reference to FIG. 1, an illustration of a structural analysis system is depicted in the form of a block diagram in accordance with an illustrative embodiment. In this illustrative example, structural analysis system 100 may be used to perform structural analysis 102 of structure 104.

Structure 104 may take a number of different forms. Structure 104 may be comprised of any number of parts, members, sub-assemblies, assemblies, joints, surfaces, and other types of structural components and features. For example, without limitation, structure 104 may take the form of a container, an overhead bin, a door system, a mechanical device, an aircraft structure, a spacecraft structure, some other type of vehicle structure, or some other type of structure or structural system.

In these illustrative examples, structure 104 may include set of joints 105. As used herein, a "set of" items may include one or more items. In this manner, set of joints 105 may include one or more joints. Further, set of joints 105 may include one or more different types of joints in these examples. Set of joints 105 may include at least one of mortise and tenon joint 106, blind rabbet joint 108, blind chai joint 110, parallel-plane insert joint 112, or some other type of joint.

As used herein, the phrase "at least one of," when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required.

For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Structural analysis 102 may include determining the effects of loads on structure 104. For example, structural analysis 102 may include identifying the structural capacity of structure 104 when certain loads are applied to structure 104. In these illustrative examples, structural analysis 102 may include computing set of final parameters 114 for each of set of joints 105.

In one illustrative example, each of set of final parameters 114 may be some measure of the strength capacity of the corresponding one of set of joints 105. In one illustrative example, set of final parameters 114 may take the form of set of margin of safety parameters 116.

As one illustrative example, joint 118 may be an example of one of set of joints 105. Joint 118 may also be referred to as a joint of interest. Set of margin of safety parameters 116 for joint 118 may include a margin of safety parameter for each of set of parameters of interest 120 for joint 118. Values for set of parameters of interest 120 may be computed for one or more load conditions.

For example, structural analysis 102 may be performed by simulating a load condition 122. Load condition 122 may include, for example, without limitation, the application of selected load 124 to joint 118, set of joints 105, or structure 104. Set of parameters of interest 120 for joint 118 may include, for example, without limitation, a set of forces of interest and a moment that are created in response to load condition 122. This set of forces may be a set of reactive forces that are generated at joint 118 in response to load condition 122.

A margin of safety parameter for a particular parameter within set of parameters of interest 120 may be for example, a measure of the capacity of joint 118 with respect to that particular parameter of interest. As one illustrative example, a margin of safety parameter for a particular force may be expressed as follows:

$$MS = n - 1$$

where $$n = ASt/RSt$$

where MS is the margin of safety parameter, n is a factor of safety (FoS), ASt is actual strength, and RSt is required strength. The factor of safety may also be referred to as a safety factor (SF).

In these illustrative examples, structural analysis system 100 may be implemented in software, hardware, firmware, or a combination thereof. When software is used, the operations performed by structural analysis system 100 may be implemented using, for example, without limitation, program code configured to run on a processor unit. When firmware is used, the operations performed by structural analysis system 100 may be implemented using, for example, without limitation, program code and data and stored in persistent memory to run on a processor unit.

When hardware is employed, the hardware may include one or more circuits that operate to perform the operations performed by structural analysis system 100. Depending on the implementation, the hardware may take the form of a circuit system, an integrated circuit, an application specific integrated circuit (ASIC), a programmable logic device, or some other suitable type of hardware device configured to perform any number of operations.

A programmable logic device may be configured to perform certain operations. The device may be permanently configured to perform these operations or may be reconfigurable. A programmable logic device may take the form of, for example, without limitation, a programmable logic array, a programmable array logic, a field programmable logic array, a field programmable gate array, or some other type of programmable hardware device.

In some illustrative examples, the operations and/or processes performed by structural analysis system 100 may be performed using organic components integrated with inorganic components. In some cases, the operations and/or processes may be performed by entirely organic components, excluding a human being. As one illustrative example, circuits in organic semiconductors may be used to perform these operations and/or processes.

In one illustrative example, structural analysis system 100 may be implemented using computer system 125. Computer system 125 may include one or more computers in communication with each other. As depicted, structural analysis system 100 may include model transformer 126 and analyzer 128. Each of model transformer 126 and analyzer 128 may be implemented using hardware, software, firmware, or a combination thereof. In some cases, model transformer 126 and analyzer 128 may be implemented using different computers, different processor units, or some other type of different special-purposes data processing devices. In other cases, model transformer 126 and analyzer 128 may be implemented on a same computer, same processor unit, or some other type of same special-purpose data processing device.

As depicted, model transformer 126 may receive a finite element model 130 of structure 104. Finite element model 130 may take the form of a three-dimensional model comprised of polygonal or polyhedral shapes that are interconnected. The points at which these polygonal or polyhedral shapes are interconnected may be referred to as nodes or nodal points. The polygonal or polyhedral shapes may be referred to as solid elements or finite elements. In one illustrative example, finite element model 130 may be referred to as a finite element mesh or simply, a mesh. Depending on the implementation, model transformer 126 may retrieve finite element model 130 from database 127.

Model transformer 126 may be configured to transform finite element model 130 by adding set of joint elements 132 to finite element model 130 of structure 104. Set of joint elements 132 may be added to set of joint locations 134 in finite element model 130. Each of set of joint elements 132 may be a one-dimensional element.

In one illustrative example, model transformer 126 may include node manager 133 and element creator 131. Each of node manager 133 and element creator 131 may be implemented using hardware, firmware, software, or some combination thereof, in a manner similar to that described above.

Node manager 133 may identify set of joint locations 134 in finite element model 130 based on geometry data 138 for structure 104. Geometry data 138 may indicate the location at which each of set of joints 105 is located on structure 104. Geometry data 138 may include, for example, without limitation, a computer-aided design (CAD) model of structure 104, data in a part geometry file for structure 104, other types of geometry data, or some combination thereof. In some illustrative examples, the finite element model 130 and geometry data 138 for structure 104 may be derived from a computer-aided design (CAD) file including a three-dimensional model of structure 104 in a global coordinate system. Geometry data 138 may include information about the dimensions of structure 104 and each part that makes up structure 104, the location of each of set of joints 105 that make up structure 104, identification of the various surfaces and edges that make up structure 104, other types of information, or some combination thereof. In some cases, geometry data 138 may be stored in database 127.

As one illustrative example, node manager 133 may use geometry data 138 for structure 104 to identify each location in finite element model 130 that represents a joint of interest. Joint location 141 may be an example of one of set of joint locations 134. Joint location 141 may be the location in finite element model 130 corresponding to joint 118 of structure 104.

Node manager 133 then identifies set of node pairs 135 corresponding to set of joint locations 134. In particular, set of node pairs 135 may include a node pair for each of set of joint locations 134. For example, node pair 136 may be identified for joint location 141 for joint 118 in structure 104. Node pair 136 may include two nodes.

In some cases, the two nodes in node pair 136 may be substantially coincident at joint location 141. In other cases, the two nodes may be located near joint location 141 in finite element model 130 and separated by a distance below some selected threshold.

The two nodes in node pair 136 may be classified by determining which portion of joint 118 is represented by each of these two nodes. For example, the two nodes may include one node that represents an insert portion 150 of joint 118 and another node that represents receiving portion 152 of joint 118.

In these illustrative examples, node manager 133 may classify a first node of node pair 136 as insert node 142 corresponding to insert portion 150 and a second node of node pair 136 as receiving node 144 corresponding to receiving portion 152. In one illustrative example, node manager 133 may use geometry data 138 to classify insert node 142 and receiving node 144. In other illustrative examples, node manager 133 may use finite element model 130 itself to classify insert node 142 and receiving node 144.

Insert node 142 may be considered as belonging to an insertion portion, tab, or other similar surface of finite element model 130. Receiving node 144 may be considered as belonging to a receiving surface of finite element model 130.

For example, in finite element model 130, insert node 142 may be associated with first number of elements 146 in finite element model 130. In particular, insert node 142 may be attached to first number of elements 146. Receiving node 144 may be associated with second number of elements 148. In particular, receiving node 144 may correspond to second number of elements 148. As used herein, a "number of" items may include one or more items.

The particular node of node pair 136 having fewer elements associated with that node may be classified as representing insert portion 150. In this manner, insert node 142 may be classified as representing insert portion 150 and receiving node 144 may be classified as representing receiving portion 152 when first number of elements 146 includes fewer elements than second number of elements 146.

As one illustrative example, first number of elements 146 attached to insert node 142 may include two elements. Second number of elements 148 attached to receiving node 144 may include three elements. The two elements may be different elements from the three elements. Based on this information, node manager 133 may identify insert node 142 and receiving node 144 as representing insert portion 150 and receiving portion 152, respectively, of joint 118.

In this manner, node manager 133 may use at least one of geometry data 138, first number of elements 146, or second number of elements 148 to classify insert node 142 and receiving node 144 as representing insert portion 150 and receiving portion 152, respectively. Depending on the type of joint 118, insert portion 150 may be referred to as tab 151 and receiving portion 152 may be referred to as slot 153 in some cases.

In some illustrative examples, tab 151 may also be referred to as a joint tab. Thus, insert node 142 may be considered as corresponding to or representing a joint tab. Further, in some cases, the portion of structure 104 that has receiving portion 152 may be referred to as a receiving surface or a joint receiving surface. In this manner, depending on the implementation, receiving node 144 may be considered as corresponding to or representing slot 153 or the receiving surface.

Based on the identification of joint location 141 and the classification of insert node 142 and receiving node 144 by node manager 133, element creator 131 may create joint element 154. Joint element 154 may take the form of one-dimensional element 155 that is added to finite element model 130. In some illustrative examples, joint element 154 may extend between insert node 142 and receiving node 144.

Element creator 131 may then assign local coordinate system 156 to joint element 154 based on the classification of insert node 142 and receiving node 144. Local coordinate system 156 may be independent of global coordinate system 158 for finite element model 130 of structure 104.

Local coordinate system 156 for corresponding joint element 154 may comprise set of axes 160. Set of axes 160 may include, for example, without limitation, an X-axis, a Y-axis, and a Z-axis. In this illustrative example, set of axes 160 may take the form of set of force axes 161. Set of axes 160 may be described in greater detail in FIG. 2 below.

Set of axes 160, and thereby local coordinate system 156, may have an origin that is positioned relative to joint location 141. In one illustrative example, insert node 142 and receiving node 144 may be substantially coincident with each other at joint location 141. In this example, set of axes 160 may intersect at joint location 141. In another illustrative example, insert node 142 and receiving node 144 may have a distance between them. In some cases, joint location 141 may be the center point between these two nodes. In other cases, a center point between these two nodes may need to be identified by element creator 131. Element creator 131 may create set of axes 160 such that set of axes 160 intersect at, or have an origin at, this center point or at joint location 141 when joint location 141 is not the center point.

Element creator 131 may create a corresponding local coordinate system for each of set of joint elements 132 in a manner similar to local coordinate system 156 for joint element 154. Thus, model transformer 126 creates set of local coordinate systems 162 for set of joint elements 132. The creation of set of joint elements 132 in finite element model 130 and the assignment of set of local coordinate systems 162 to set of joint elements 132 transforms finite element model 130 into transformed finite element model 164.

Any number of criteria may be stored in database 127 and used by node manager 133 to classify insert node 142 and receiving node 144. Similarly, any number of criteria may be stored in database 127 and used by element creator 131 to create set of local coordinate systems 162 for set of joint elements 132 based on the classification of insert node 142 and receiving node 144.

In some cases, each of set of local coordinate systems 162 may be considered as being part of the corresponding joint element to which the local coordinate system is assigned. For example, local coordinate system 156 may be considered as being part of joint element 154. Thus, adding joint element 154 to finite element model 130 may be considered as both creating one-dimensional element 155 in finite element model 130 and assigning local coordinate system 156 to one-dimensional element 155.

Analyzer 128 may then perform structural analysis 102 using transformed finite element model 164. Structural analysis 102 may be performed by, for example, without limitation, simulating any number of load conditions. For example, load condition 122 may be simulated by simulating the application of selected load 124 to a selected location on structure 104 using transformed finite element model 164. The response of set of joints 105, as represented by set of joint elements 132 in transformed finite element model 164, to load condition 122 may be computed with respect to set of local coordinate systems 162.

In particular, the response may be computed as a value for each of set of parameters of interest 120, which may be computed for at least one joint in set of joints 105. For example, without limitation, the response of joint 118 represented by joint element 154 in transformed finite element model 164 to load condition 122 may be computed as a value for each of set of parameters of interest 120 for joint 118. Set of parameters of interest 120 are described in greater detail in FIG. 2 below.

Analyzer 128 may generate final output 166 based on structural analysis 102. Final output 166 may include, for example, without limitation, set of margin of safety parameters 116 for each of set of joints 105 in structure 104 for which set of parameters of interest 120 was computed.

Performing structural analysis 102 using transformed finite element model 164 having set of joint elements 132 with set of local coordinate systems 162 may improve the quality, or accuracy, of final output 166 generated by analyzer 128. Model transformer 126 may generate transformed finite element model 164 with reduced error as compared to a transformed finite element model having joint elements created manually by a human operator. In this manner, the accuracy of final output 166 may be improved.

Further, model transformer 126 may significantly reduce the time and effort needed to create set of joint elements 132 and set of local coordinate systems 162. Still further, model transformer 126 may improve the consistency and efficiency with which transformed finite element model 164 is generated as compared to a human operator manually trying to identify joint locations for joint elements and the proper orientation for each local coordinate system. Model transformer 126 may be capable of identifying set of joint locations 134, creating set of joint elements 132, and assigning set of local coordinate systems 162 to set of joint elements 132 with minimal to no human input such that transformed finite element model 164 is generated without significant delay.

Final output 166 resulting from structural analysis 102 may be used to perform at least one of certification, substantiation, or validation of structure 104. In this manner, final output 166 may be used to adjust a design for structure 104, adjust a design for one or more of structure 104, perform a reworking of a component of structure 104, perform maintenance of structure 104, or perform some other type of operation related to improving at least one of the overall strength or overall life of structure 104.

By reducing the time and effort needed to generate transformed finite element model 164, model transformer 126 may reduce the overall time and effort needed for performing structural analysis 102 and for at least one of certifying, substantiating, or validating structure 104. Further, model transformer 126 may improve the overall consistency and efficiency with which structural analysis 102 and at least one of certification, substantiation, or validation of structure 104 may be performed.

Figure 2:
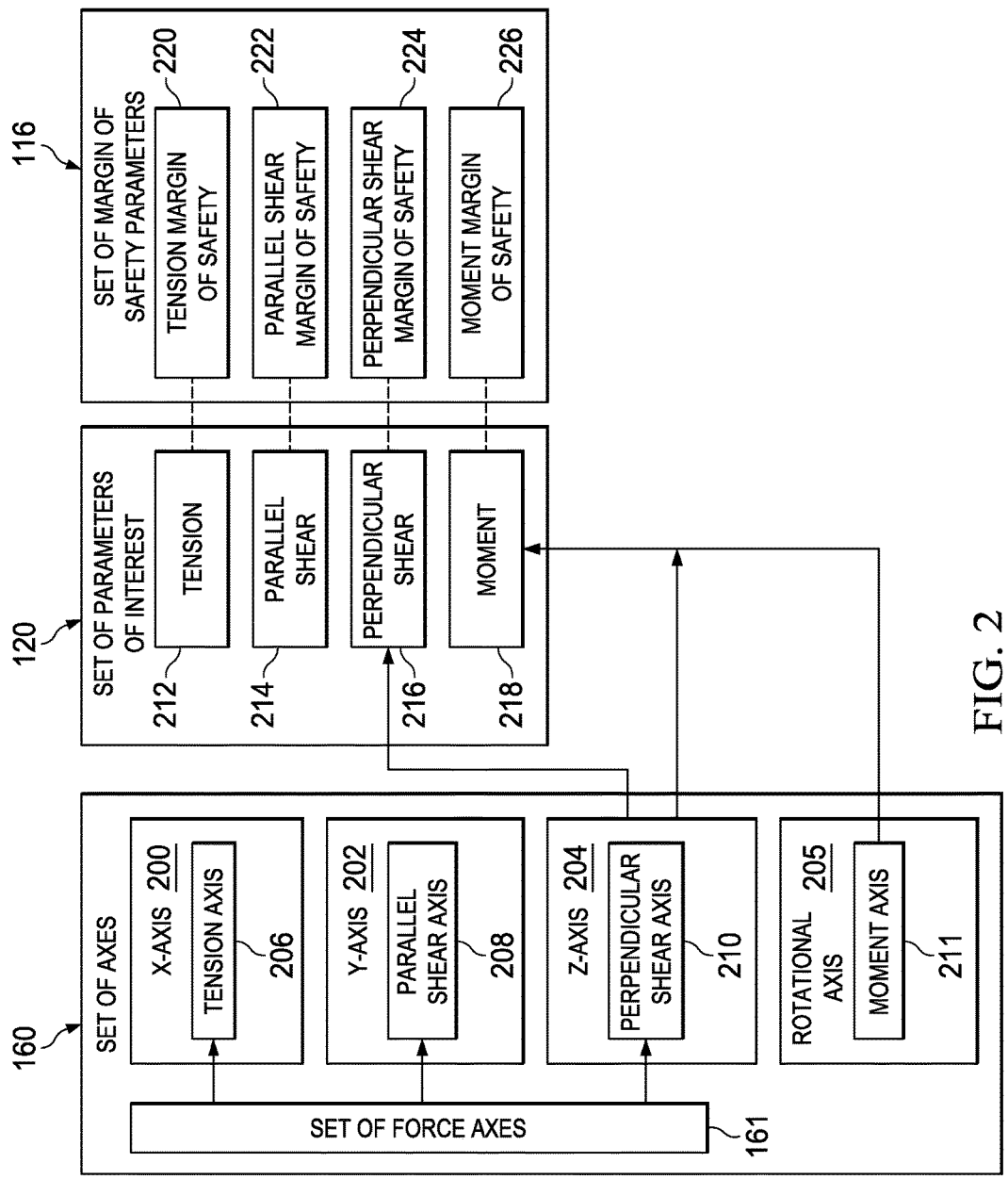
FIG. 2 is an illustration of a set of axes, a set of parameters of interest, and a set of margin of safety parameters in the form of a block diagram in accordance with an illustrative embodiment.

With reference now to FIG. 2, an illustration of set of axes 160, set of parameters of interest 120, and set of margin of safety parameters 116 from FIG. 1 is depicted in the form of a block diagram in accordance with an illustrative embodiment. As depicted, set of axes 160 may take the form of set of force axes 161.

Set of axes 160 for joint element 154 corresponding to joint 118 in FIG. 1 may include X-axis 200, Y-axis 202, and Z-axis 204. Set of force axes 161 may include tension axis 206, parallel shear axis 208, and perpendicular shear axis 210. As depicted, set of parameters of interest 120 from FIG. 1 may include tension 212, parallel shear 214, perpendicular shear 216, and moment 218. Set of margin of safety parameters 116 for set of parameters of interest 120 may include, for example, without limitation, tension margin of safety 220, parallel shear margin of safety 222, perpendicular shear margin of safety 224, and moment margin of safety 226.

X-axis 200 may extend in the direction in which insert portion 150 may be inserted into or engaged with receiving portion 152 in FIG. 1. X-axis 200 may be identified by element creator 131 in FIG. 1 as an axis substantially perpendicular to insert portion 150 in FIG. 1. X-axis 200 may be created to substantially align with the axis along which joint 118 may experience tension 212 when placed under a load condition. In this manner, X-axis 200 may be referred to as tension axis 206.

Y-axis 202 may be identified by element creator 131 in FIG. 1 as an axis substantially parallel to insert portion 150 in FIG. 1. Y-axis 202 may be substantially parallel to joint 118. In other words, Y-axis 202 may be substantially parallel to the interface formed by insert portion 150 and receiving portion 152 in FIG. 1 at joint 118. Y-axis 202 may be created to substantially align with the axis along which joint 118 may experience parallel shear 214 when placed under a load condition. In this manner, Y-axis 202 may be referred to as parallel shear axis 208. Further, moment 218 may be rotated about Y-axis 202.

Further, Z-axis 204 may be identified by element creator 131 in FIG. 1 as an axis substantially perpendicular to both X-axis 200 and Y-axis 202. Z-axis 204 may be created to substantially align with the axis along which joint 118 may experience perpendicular shear 216 when placed under a load condition. In this manner, Z-axis 200 may be referred to as perpendicular shear axis 210.

Accordingly, element creator 131 assigns local coordinate system 156 to the one-dimensional element 155 that includes an X-axis 200 substantially normal to the receiving portion 152 or surface thereof, a Y-axis 202 substantially parallel to the joint or insert portion 152, and a Z-axis substantially perpendicular to both the X-axis 200 and the Y-axis 202. Element creator 131 may further be configured to generate the display of the local coordinate system X-axis 200, Y-axis 202 and Z-axis 204 over a display of the finite element model 130, where the local coordinate system may be aligned with a set of axes corresponding to a set of joint allowables for joint 118 as part of structural analysis 102.

In some illustrative examples, set of axes 160 may also include rotational axis 205. Rotational axis 205 may be referred to as moment axis 211. Rotational axis 205 may be the axis about Y-axis 202. Moment 218 may be experienced along rotational axis 205.

Set of parameters of interest 120 may also be referred to as a set of stresses, depending on the implementation. For a particular one of set of joints 105 in FIG. 1, each of set of margin of safety parameters 116 may be described as the ratio of the allowable stress for that particular joint or that type of joint to the loads applied to that joint based on load condition 122, described in FIG. 1, minus 1. In this manner, each of set of margin of safety parameters 116 may change based on load condition 122 in FIG. 1. In some cases, each of set of margin of safety parameters 116 may be expressed as a percentage.

For example, tension margin of safety 220 may be described as the ratio of the allowable tension stress for a particular joint in structure 104 or type of joint to the loads applied to that joint based on load condition 122 described in FIG. 1. Similarly, parallel shear margin of safety 222 may be described as the ratio of the allowable parallel shear stress for a particular joint in structure 104 or type of joint to the loads applied to that joint based on load condition 122 described in FIG. 1. Further, perpendicular shear margin of safety 224 may be described as the ratio of the allowable perpendicular shear stress for a particular joint in structure 104 or type of joint to the loads applied to that joint based on load condition 122 described in FIG. 1. Moment margin of safety 226 may be described as the ratio of the allowable moment stress for a particular joint in structure 104 or type of joint to the loads applied to that joint based on load condition 122 described in FIG. 1.

The illustrations of structural analysis system 100 in FIG. 1 and set of axes 160, set of parameters of interest 120, and set of margin of safety parameters 116 in FIGS. 1 and 2 are not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

For example, without limitation, node manager 133 may be implemented as part of element creator 131 in other illustrative examples. In some illustrative examples, model transformer 126 may be implemented separately from structural analysis system 100. In still other cases, model transformer 126 may be implemented as a tool of some other type of system.

Figure 3:
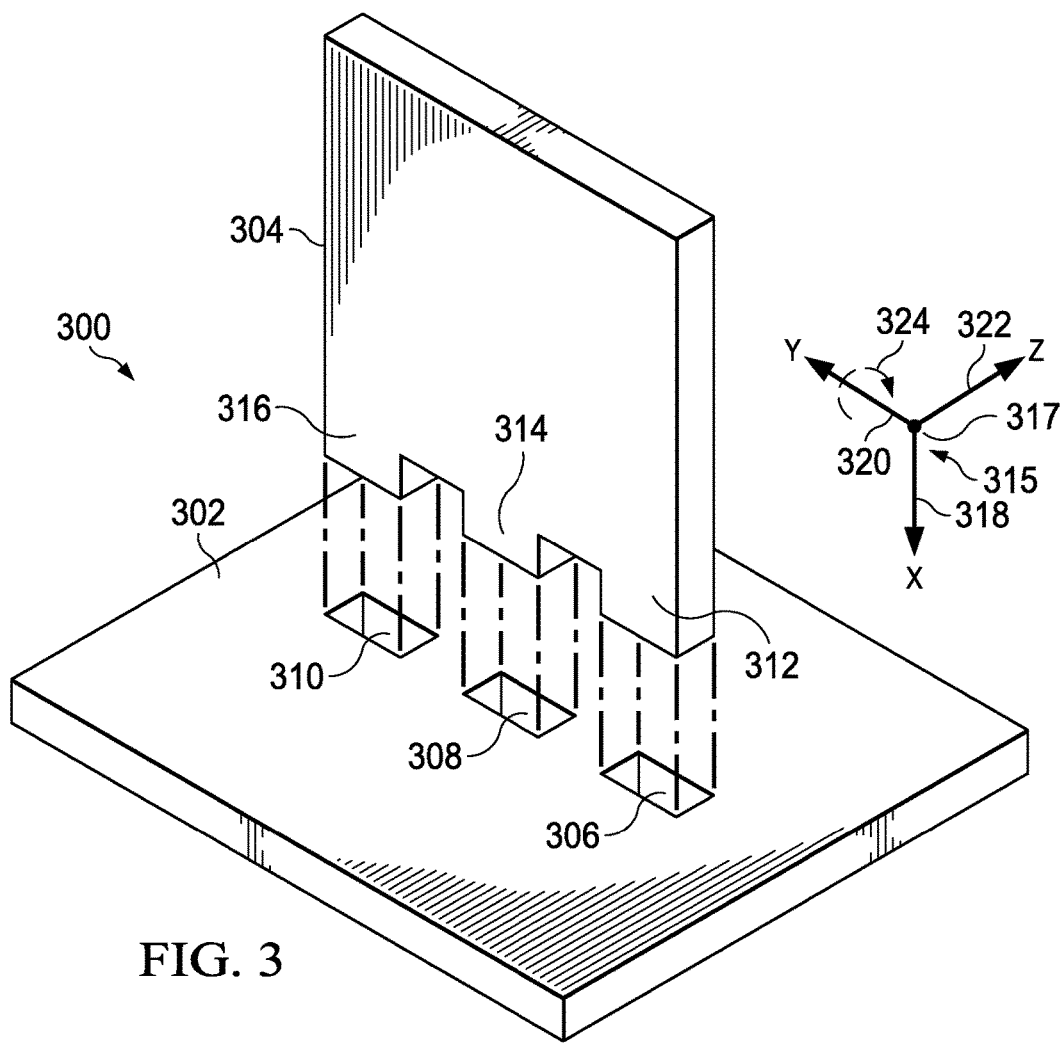
FIG. 3 is an illustration of a structure in accordance with an illustrative embodiment.

With reference now to FIG. 3, an illustration of a structure is depicted in accordance with an illustrative embodiment. Structure 300 may be an example of one implementation for structure 104 in FIG. 1. In this illustrative example, structure 300 includes first part 302 and second part 304.

As depicted, first part 302 may have slot 306, slot 308, and slot 310. These slots may also be referred to as receiving surfaces in other examples. Second part 304 may have tab 312, tab 314, and tab 316. Tab 312, tab 314, and tab 316 may be engaged with slot 306, slot 308, and slot 310, respectively, to form joints. In other words, the tabs in first part 302 may be inserted into the slots in second part 304 to form joints for structure 300.

In this illustrative example, local coordinate system 315 may be an example of one implementation for local coordinate system 156 in FIG. 1. Local coordinate system 315 may be assigned to a particular joint element in a finite element model based on the identification of an insert node in the finite element model that represents tab 312 and a receiving node in the finite element model that represents slot 306. Local coordinate system 315 may have origin 317.

As depicted, local coordinate system 315 may have a set of axes that includes X-axis 318, Y-axis 320, and Z-axis 322. In this illustrative example, X-axis 318, Y-axis 320, and Z-axis 322 may be an example of one implementation for set of axes 160 in FIG. 1. Further, X-axis 318, Y-axis 320, and Z-axis 322 may be examples of implementations for X-axis 200, Y-axis 202, and Z-axis 204, respectively, in FIG. 2. Rotational axis 324 is also depicted about Y-axis 202. Rotational axis 324 may be an example of one implementation for rotational axis 205 in FIG. 2.

A similar local coordinate system may be identified for the joint formed by tab 314 and slot 308 and the joint formed by tab 316 and slot 310. These local coordinate systems may be used during the performance of structural analysis to compute the tension, parallel shear, perpendicular shear, and moment that is generated at each of the corresponding joints in response to a load condition. This data may then be used to compute, for example, without limitation, a tension margin of safety, a parallel shear margin of safety, a perpendicular shear margin of safety, and a moment margin of safety for each of the joints under that load condition.

As one illustrative example, structural analysis may be performed to compute the response of the joint formed by tab 312 and slot 306 in response to a selected load condition. The response along X-axis 318 may be used as the tension at the joint. The response along Y-axis 320 may be used as the parallel shear at the joint. The response along Z-axis 322 may be used as the perpendicular shear at the joint. The moment computed about Y-axis 320, which may be along rotational axis 324, may be used as the moment at the joint.

An overall margin of safety parameter may also be identified for each joint. For example, the margin of safety parameter may be identified using the following:

$$MS = \frac{1}{FF \cdot (R_T + R_{IS} + R_{LS} + R_M)} - 1$$

where FF refers to fitting factors, $R_T$ is the ratio of the computed tension to the allowable tension, $R_{IS}$ is the ratio of the computed parallel shear to the allowable parallel shear, $R_{LS}$ is the computed perpendicular shear to the allowable shear, and $R_M$ is the computed moment to the allowable moment. The fitting factors, FF, may be obtained based on, for example, without limitation, experimentation.

Figure 4:
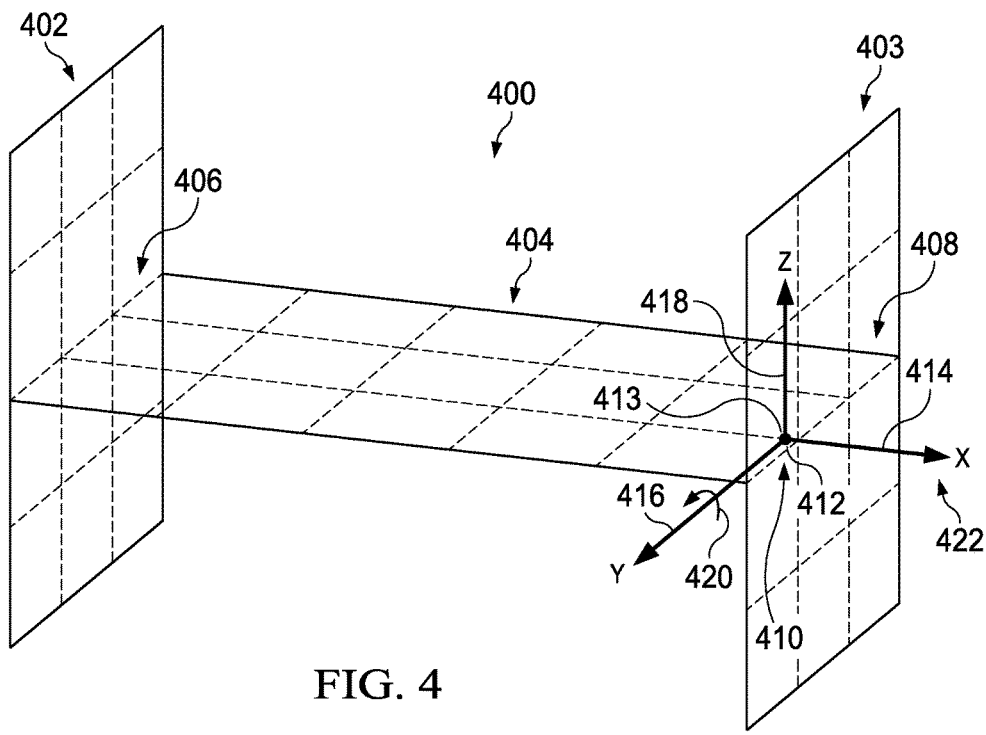
FIG. 4 is an illustration of a finite element model of a structure in accordance with an illustrative embodiment.

With reference now to FIG. 4, an illustration of a finite element model of a structure is depicted in accordance with an illustrative embodiment. In this illustrative example, finite element model 400 may be an example of one implementation for finite element model 130 in FIG. 1.

Finite element model 400 includes surface 402, surface 403, and surface 404. Any number of joints may connect surface 404 to surface 402 at interface 406. For example, interface 406 may represent the mating of tabs and slots at the edges of surface 404 with slots on surface 402. Similarly, any number of joints may connect surface 404 to surface 403 at interface 408. For example, interface 408 may represent the mating of tabs at the edge of surface 404 with slots on surface 403. In this manner, surface 404 may be considered the insertion surface. Surface 402 and surface 404 may be considered receiving surfaces.

As one illustrative example, joint location 410 may be identified as representing a joint between a tab represented along the edge of surface 404 and a slot represented on surface 403. Node 412 and node 413 may be coincident at joint location 410.

Node 412 may be identified as lying along the edge of surface 404. Thus, node 412 may be classified as an insert node representing a tab. Node 413 may be identified as lying in the middle of surface 403. Thus, node 413 may be classified as a receiving node representing a slot. A one-dimensional element may be created at joint location 410. X-axis 414, Y-axis 416, Z-axis 418, and rotational axis 420 may be created and assigned to this one-dimensional element. X-axis 414, Y-axis 416, Z-axis 418, and rotational axis 420 may form local coordinate system 422.

As depicted, X-axis 414 extends in a direction from the tab towards the slot. In other words, X-axis 414 may be in a direction substantially perpendicular to surface 403. Y-axis 416 may be substantially parallel to interface 408. Z-axis 418 may be perpendicular to X-axis 414 and Y-axis. Further, Z-axis may be substantially parallel to surface 403.

Figure 5:
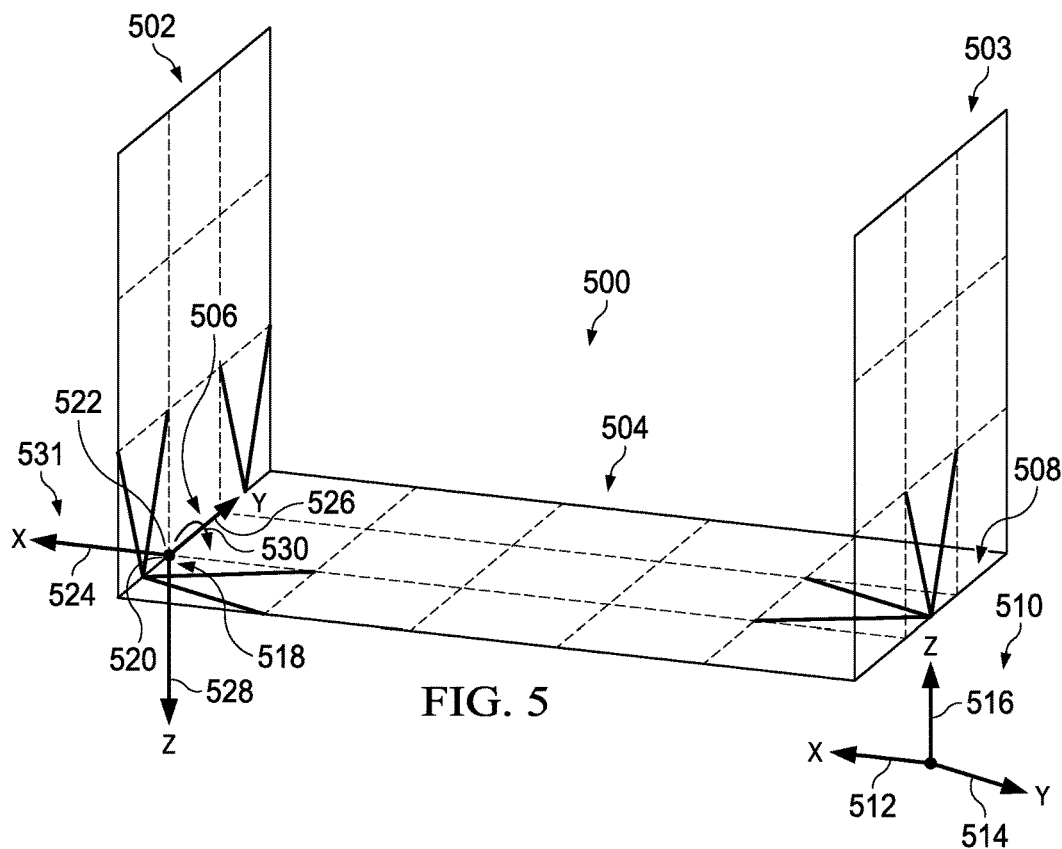
FIG. 5 is an illustration of a finite element model of a structure in accordance with an illustrative embodiment.

With reference now to FIG. 5, an illustration of a finite element model of a structure is depicted in accordance with an illustrative embodiment. In this illustrative example, finite element model 500 may be an example of one implementation for finite element model 130 in FIG. 1.

Finite element model 500 includes surface 502, surface 503, and surface 504. Any number of joints may connect surface 504 to surface 502 at interface 506. For example, interface 506 may represent the mating of tabs at the edge of surface 504 with slots on surface 502. Similarly, any number of joints may connect surface 504 to surface 503 at interface 508. For example, interface 508 may represent the mating of tabs at the edge of surface 504 with slots on surface 503.

Finite element model 500 may have global coordinate system 510 with global X-axis 512, global Y-axis 514, and global Z-axis 516. Joint location 518 may be an example of one location where a joint may be located. Node 520 and node 522 may be coincident at joint location 518. Node 520 and node 522 both lie along the edges of surface 502 and surface 504. Consequently, it may not be readily apparent which of node 520 and node 522 represents the tab and which represents the slot.

The node that lies along the edge of the surface that is roughly in a direction of global X-axis 512 is classified as the insert node representing the tab of the joint with the other node being classified as the receiving node representing the slot. In this illustrative example, node 520 may lie along the edge of surface 504, which is roughly in the direction of global X-axis 514. Consequently, node 520 may be classified as the insert node representing the tab and node 522 may be classified as the receiving node.

Based on this classification, X-axis 524, Y-axis 526, Z-axis 528, and rotational axis 530 may be created. X-axis 524, Y-axis 526, Z-axis 528, and rotational axis 530 may form local coordinate system 531.

In other illustrative examples, node 520 and node 522 may be arbitrarily or randomly classified. Both nodes may be edge nodes. One of the edge nodes may be classified as the insert node and the other edge node may be classified as the receiving node. The X-axis and the Z-axis may be selected as the axes normal to surface 504 and surface 502, respectively. Which normal axis becomes the X-axis and which becomes the Z-axis may be arbitrarily or randomly selected. The Y-axis may then be selected based on the right-hand rule. The Y-axis may be the cross-product of the X-axis and the Z-axis.

Figure 6:
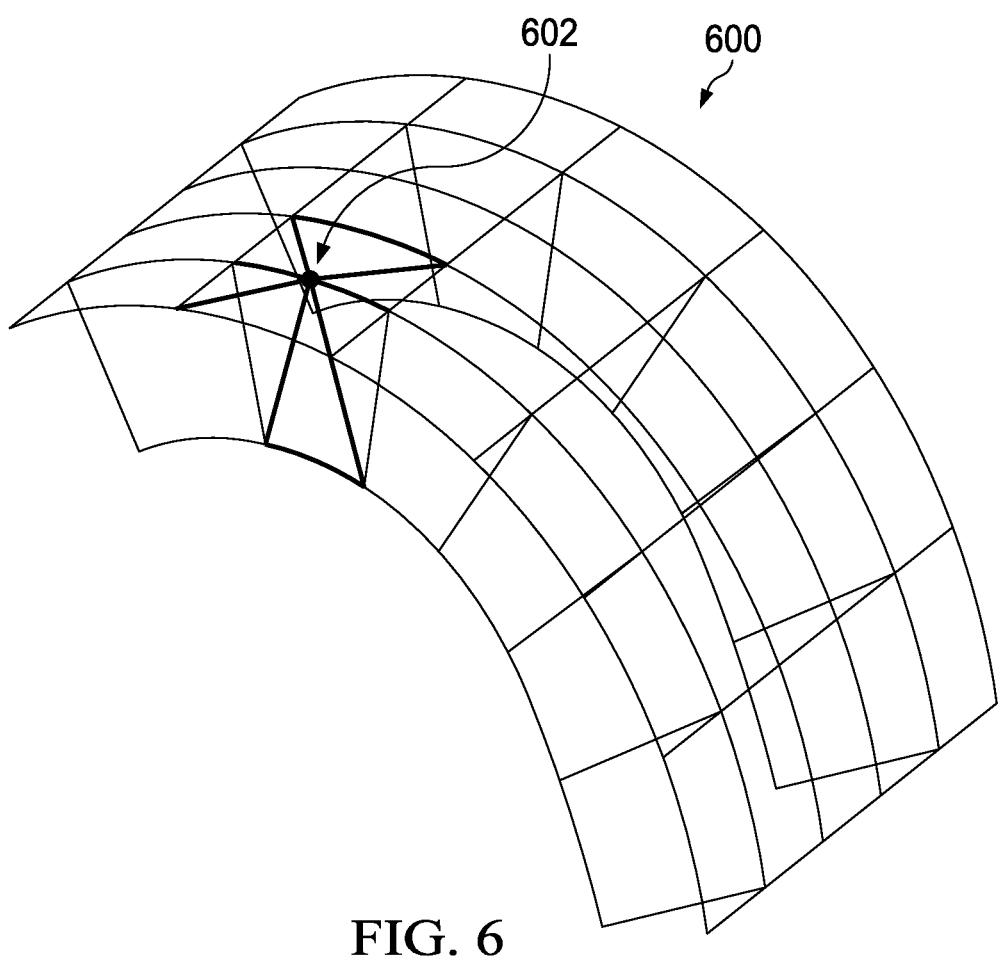
FIG. 6 is an illustration of a finite element model of a curved structure in accordance with an illustrative embodiment.

With reference now to FIG. 6, an illustration of a finite element model of a curved structure is depicted in accordance with an illustrative embodiment. Finite element model 600 may be of a curved structure. The methodology for creating joint elements and local coordinate systems described above may also be used to create joint elements and accurate local coordinate systems for finite element models of curved structures.

In one illustrative example, a joint element may be created at joint location 602. A local coordinate system may be assigned to this joint element with an origin positioned at joint location 602.

Figure 7:
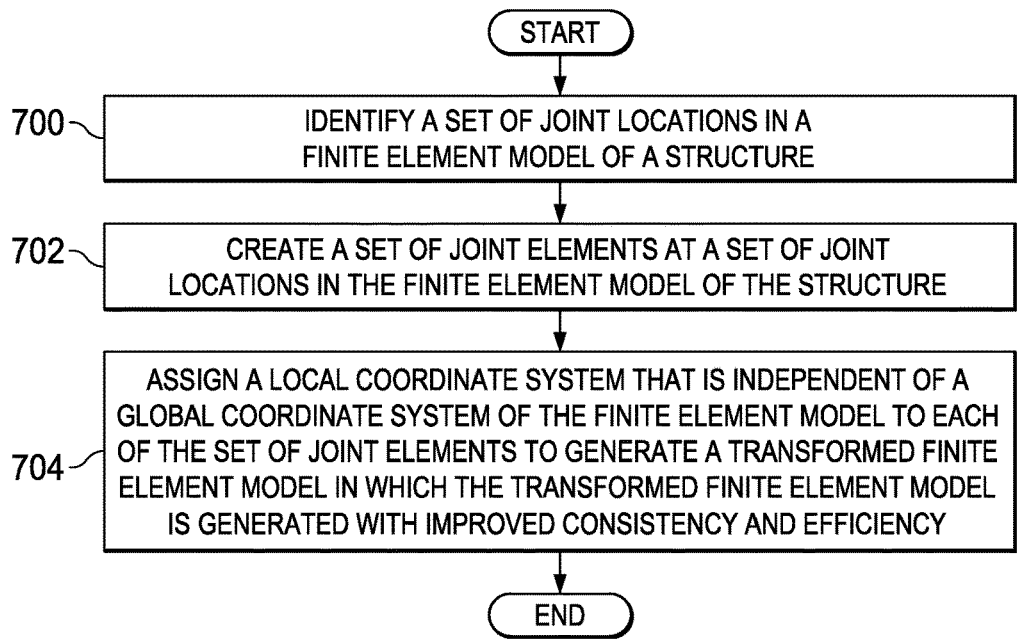
FIG. 7 is an illustration of a process for transforming a finite element model in the form of a flowchart in accordance with an illustrative embodiment.

With reference now to FIG. 7, an illustration of a process for transforming a finite element model is depicted in the form of a flowchart in accordance with an illustrative embodiment. The process illustrated in FIG. 7 may be implemented using analysis system 100 in FIG. 1.

The process may include identifying a set of joint locations in a finite element model of a structure (operation 700). A set of joint elements may be created at a set of joint locations in the finite element model of the structure (operation 702).

Next, a local coordinate system that is independent of a global coordinate system of the finite element model may be assigned to each of the set of joint elements to generate a transformed finite element model in which the transformed finite element model is generated with improved consistency and efficiency (operation 704), with the process terminating thereafter. In particular, the process described in FIG. 7 may be used to generate the transformed finite element model that includes a unique local coordinate system assigned to each joint element representing a joint in a structure with improved consistency and efficiency and with reduced error as compared to when the set of joint elements is created and added to the finite element model with the corresponding set of local coordinate systems manually by a human operator. The unique local coordinate system for each joint element may be aligned with a set of axes corresponding to a set of joint allowables for the joint. In this manner, structural analysis of the structure may be performed using the transformed finite element model having the unique local coordinate system for each joint element with improved consistency and efficiency and with reduced error.

Structural analysis system 100 in FIG. 1 may be utilized to generate a transformed finite element model having a local coordinate system for each joint element representing a joint and to perform structural analysis to compute at least one margin of safety parameter associated with the joint in response to a selected load condition. Structural analysis system 100 may further generate an output file that includes the transformed finite element model having the local coordinate systems for each joint element representing a joint associated with a structure.

Figure 8:
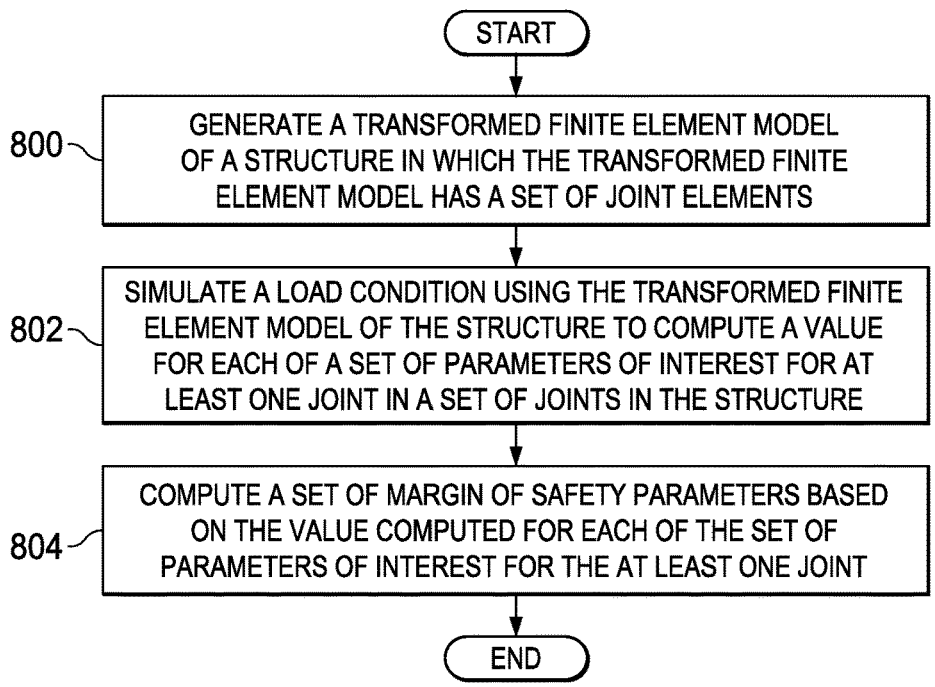
FIG. 8 is an illustration of a process for performing a structural analysis of a structure in the form of a flowchart in accordance with an illustrative embodiment.

With reference now to FIG. 8, an illustration of a process for performing a structural analysis of a structure is depicted in the form of a flowchart in accordance with an illustrative embodiment. The process illustrated in FIG. 8 may be implemented using structural analysis system 100 in FIG. 1.

The process may begin by generating a transformed finite element model of a structure in which the transformed finite element model has a set of joint elements (operation 800). Operation 800 may be performed using a process implemented in a manner similar to the process described in FIG. 7 above.

Thereafter, a load condition may be simulated using the transformed finite element model of the structure to compute a value for each of a set of parameters of interest for at least one joint in a set of joints in the structure (operation 802). In operation 802, the load condition may include the application of a selected load to at least one of a joint in the structure, a set of joints in the structure, or the structure. The set of parameters of interest for a joint may include, for example, without limitation, tension, parallel shear, perpendicular shear, and moment resulting from the load condition.

Next, a set of margin of safety parameters may be computed based on the value computed for each of the set of parameters of interest for the at least one joint (operation 804), with the process terminating thereafter. The information computed in operation 806 may be used to perform at least one of substantiation, certification, or validation of the structure.

Figure 9B:
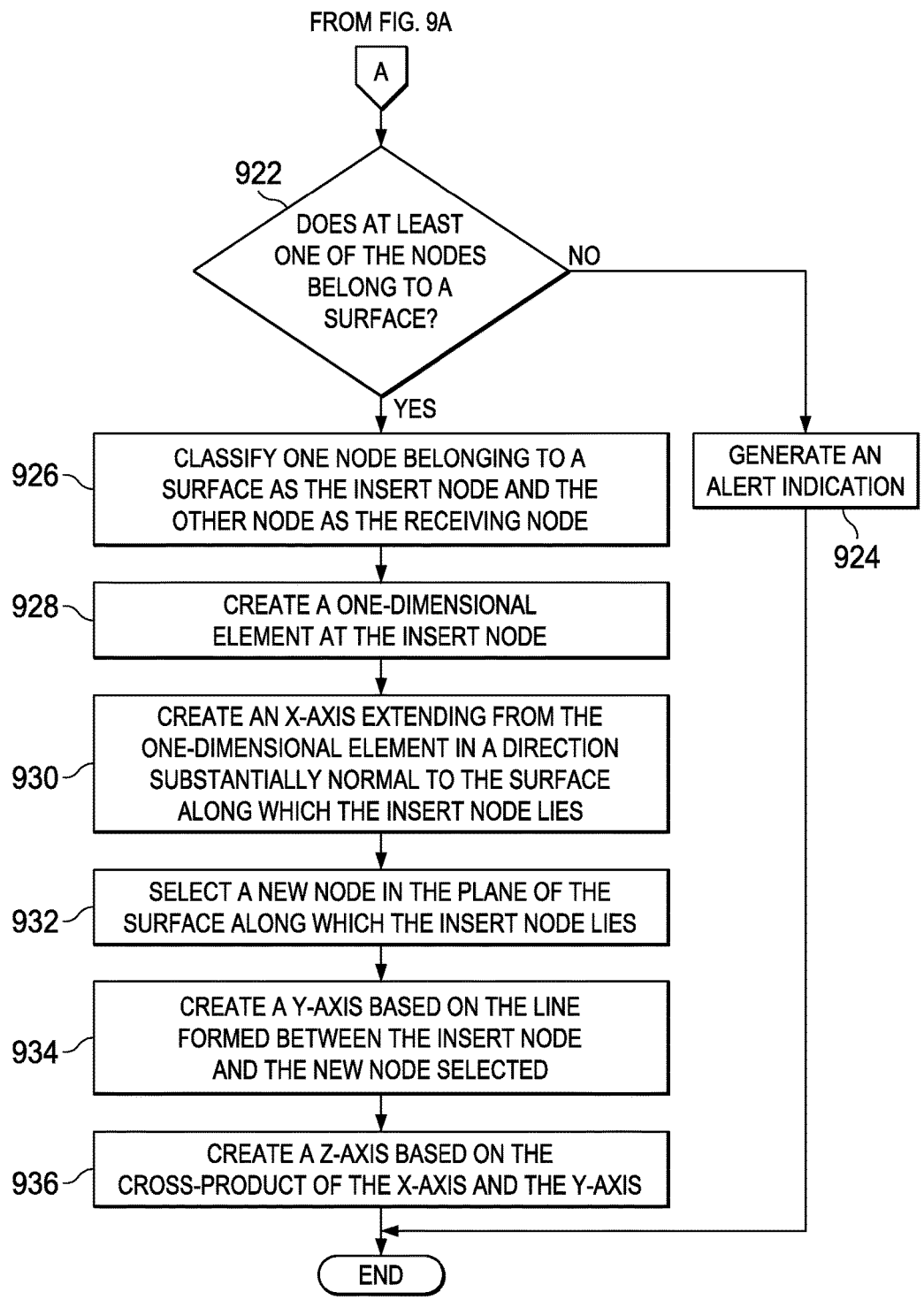

With reference now to FIGS. 9A and 9B, an illustration of a process for adding a joint element for a joint to a finite element model of a structure is depicted in the form of a flowchart in accordance with an illustrative embodiment. The process illustrated in FIGS. 9A and 9B may be implemented using model transformer 126 in FIG. 1.

The process may begin by identifying a joint location in a finite element model of a structure corresponding to where a joint is located on the structure based on geometry data for the structure (operation 900). The joint may take a number of different forms, including, but not limited to, a mortise and tenon joint, a blind rabbet joint, or some other type of joint.

Next, a node pair in the finite element model corresponding to the joint location is identified in which the two nodes belong to two different surfaces in the finite element model (operation 902). A determination is made as to whether one of the nodes in the node pair is an edge node belonging to a first surface in the finite element model with the other node in the node pair being a non-edge node belonging to a second surface in the finite element model (operation 904). An edge node is a node that lies along an edge of a surface. A non-edge node is a node that lies along the middle of a surface. The non-edge node may or may not belong to a surface, depending on the implementation. When the determination in operation 904 is yes, the joint be a mortise and tenon joint.

If the determination in operation 904 is yes, then the edge node is classified as an insert node and the non-edge node is classified as a receiving node (operation 906). The first surface to which the edge node belongs may thus be referred to as an insertion surface and the second surface to which the non-edge node belongs may be referred to as a receiving surface. The insert node may represent an insert portion of the joint. The receiving node may represent a receiving portion of a joint.

If the determination in operation 904 is no, then a determination is made as to whether both nodes are edge nodes belonging to two different surfaces (operation 908). When the determination in operation 908 is yes, then the joint is a blind rabbet joint. With reference to operation 908, if both nodes are edge nodes belonging to two different surfaces, then one of the edge nodes is classified as an insert node and the other edge node is classified as a receiving node (operation 910).

In one illustrative example, operation 910 may be performed by arbitrarily or randomly classifying one of the two edge nodes as the insert node and the other edge node as the receiving node. In other illustrative examples, the edge node lying along an edge that is roughly in the same direction as the X-axis of the global coordinate system for the finite element model is classified as the insert node representing an insert portion of the joint, while the other edge node is classified as the receiving node representing a receiving portion of the joint.

Once the insert node and the receiving node have been classified in either operation 910 or operation 906, a one-dimensional element is created in the finite element model (operation 912). In operation 912, when the two nodes are coincident at the joint location, the one-dimensional element may be created at the joint location. However, when the two nodes are not coincident at the joint location, the one-dimensional element may be created at the joint location or at a center point between the two nodes.

Thereafter, an X-axis that is substantially normal to the second surface along which the receiving node lies may be created extending from the one-dimensional element (operation 914). In operation 914, the X-axis may extend in a direction from the insert node to the receiving node. A Z-axis that is substantially normal to the first surface along which the insert node lies may be created extending from the one-dimensional element (operation 916).

When the joint being represented by the one-dimensional element is a mortise and tenon joint, the directionality of Z-axis may be from the insert node to the receiving node or from the receiving node to the insert node. When the joint is a blind rabbet joint, the Z-axis may be created extending in the direction from the receiving node to the insert node.

Next, a Y-axis may be created based on a cross-product of the X-axis and the Z-axis (operation 918), with the process terminating thereafter. The right-hand rule may be equivalent to defining the Z-axis as the cross-product of the X-axis and the Y-axis in this illustrative example. In this manner, a local coordinate system formed by the X-axis, the Y-axis, and the Z-axis is assigned to the one-dimensional element. This local coordinate system may inherently include the rotational axes that correspond to the X-axis, the Y-axis, and the Z-axis.

With reference again to operation 908, if both nodes are not edge nodes belonging to two different surfaces, then a determination is made as to whether at least one of the nodes belongs to a surface (operation 922). When the determination in operation 922 is yes, the joint is a parallel-plane insert joint. With reference to operation 922, if neither node belongs to a surface, the process generates an alert indication (operation 924), with the process terminating thereafter. Otherwise, the process classifies one node belonging to a surface as the insert node and the other node as the receiving node (operation 926). In some cases, when both nodes belong to surfaces, the selection of the node that will be the insert node may be randomly or arbitrarily made.

A one-dimensional element is created at the insert node (operation 928). Next, an X-axis is created extending from the one-dimensional element in a direction substantially normal to the surface along which the insert node lies (operation 930). A new node in the plane of the surface along which the insert node lies is selected (operation 932). A Y-axis is created based on the line formed between the insert node and the new node selected (operation 934). A Z-axis is created based on the cross-product of the X-axis and the Y-axis (operation 936), with the process terminating thereafter. The right-hand rule may be equivalent to defining the Z-axis as the cross-product of the X-axis and the Y-axis in this illustrative example.

In other illustrative examples, a determination in operation 908 that both nodes are edge nodes belonging to two different surfaces may result in a local coordinate system being identified differently. For example, when the edge nodes are coincident, a formal classification of which edge node is the insert node and which edge node is the receiving node may not be necessary. Rather, a random classification of one of the edge nodes as the insert node and the other edge node as the receiving node may be sufficient.

A one-dimensional element may then be created at the location of the two edge nodes. The normal axis for each of the two surfaces along which the nodes lie may be identified. One normal axis may be selected as the X-axis, while the other axis may be selected as the Z-axis. The Y-axis may then be determined based on the X-axis, the Z-axis, and the right-hand rule. In other words, the Y-axis may be defined as the cross-product of the X-axis and the Z-axis. These three axes may form the local coordinate system for the one-dimensional element.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Figure 10:
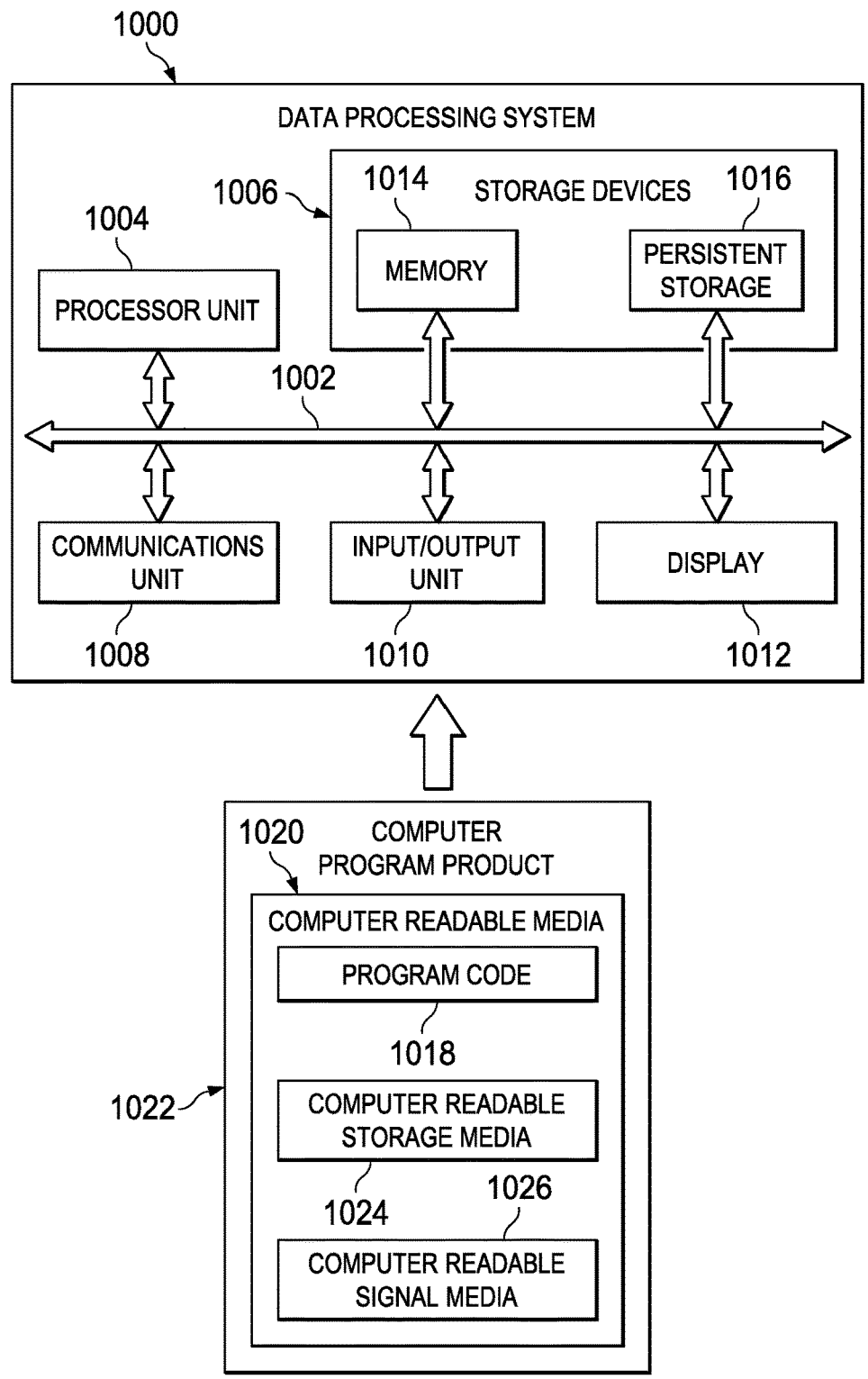
FIG. 10 is an illustration of a data processing system in the form of a block diagram in accordance with illustrative embodiment.

Turning now to FIG. 10, an illustration of a data processing system in the form of a block diagram is depicted in accordance with an illustrative embodiment. Data processing system 1000 may be used to implement at least one of structural analysis system 100, model transformer 126, or analyzer 128 in FIG. 1. As depicted, data processing system 1000 includes communications framework 1002, which provides communications between processor unit 1004, storage devices 1006, communications unit 1008, input/output unit 1010, and display 1012. In some cases, communications framework 1002 may be implemented as a bus system.

Processor unit 1004 is configured to execute instructions for software to perform a number of operations. Processor unit 1004 may comprise a number of processors, a multi-processor core, and/or some other type of processor, depending on the implementation. In some cases, processor unit 1004 may take the form of a hardware unit, such as a circuit system, an application specific integrated circuit (ASIC), a programmable logic device, or some other suitable type of hardware unit.

Instructions for the operating system, applications, and/or programs run by processor unit 1004 may be located in storage devices 1006. Storage devices 1006 may be in communication with processor unit 1004 through communications framework 1002. As used herein, a storage device, also referred to as a computer readable storage device, is any piece of hardware capable of storing information on a temporary and/or permanent basis. This information may include, but is not limited to, data, program code, and/or other information.

Memory 1014 and persistent storage 1016 are examples of storage devices 1006. Memory 1014 may take the form of, for example, a random access memory or some type of volatile or non-volatile storage device. Persistent storage 1016 may comprise any number of components or devices. For example, persistent storage 1016 may comprise a hard drive, a flash memory, a rewritable optical disk, a rewritable magnetic tape, or some combination of the above. The media used by persistent storage 1016 may or may not be removable.

Communications unit 1008 allows data processing system 1000 to communicate with other data processing systems and/or devices. Communications unit 1008 may provide communications using physical and/or wireless communications links.

Input/output unit 1010 allows input to be received from and output to be sent to other devices connected to data processing system 1000. For example, input/output unit 1010 may allow user input to be received through a keyboard, a mouse, and/or some other type of input device. As another example, input/output unit 1010 may allow output to be sent to a printer connected to data processing system 1000.

Display 1012 is configured to display information to a user. Display 1012 may comprise, for example, without limitation, a monitor, a touch screen, a laser display, a holographic display, a virtual display device, and/or some other type of display device.

In this illustrative example, the processes of the different illustrative embodiments may be performed by processor unit 1004 using computer-implemented instructions. These instructions may be referred to as program code, computer usable program code, or computer readable program code and may be read and executed by one or more processors in processor unit 1004.

In these examples, program code 1018 is located in a functional form on computer readable media 1020, which is selectively removable, and may be loaded onto or transferred to data processing system 1000 for execution by processor unit 1004. Program code 1018 and computer readable media 1020 together form computer program product 1022. In this illustrative example, computer readable media 1020 may be computer readable storage media 1024 or computer readable signal media 1026.

Computer readable storage media 1024 is a physical or tangible storage device used to store program code 1018 rather than a medium that propagates or transmits program code 1018. Computer readable storage media 1024 may be, for example, without limitation, an optical or magnetic disk or a persistent storage device that is connected to data processing system 1000.

Alternatively, program code 1018 may be transferred to data processing system 1000 using computer readable signal media 1026. Computer readable signal media 1026 may be, for example, a propagated data signal containing program code 1018. This data signal may be an electromagnetic signal, an optical signal, and/or some other type of signal that can be transmitted over physical and/or wireless communications links.

The illustration of data processing system 1000 in FIG. 10 is not meant to provide architectural limitations to the manner in which the illustrative embodiments may be implemented. The different illustrative embodiments may be implemented in a data processing system that includes components in addition to or in place of those illustrated for data processing system 1000. Further, components shown in FIG. 10 may be varied from the illustrative examples shown.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus that comprises:
a model transformer configured to:
create a set of joint elements at a set of joint locations in a finite element model of a structure; and
generate a transformed finite element model based upon an assignment of a local coordinate system to each of the set of joint elements that is independent of a global coordinate system of the finite element model, such that the transformed finite element model comprises a consistency and an efficiency improved over a manually computed finite element model; and
the local coordinate system for a corresponding joint element, of the set of joint elements, comprises a set of force axes, such that the set of force axes comprises at least one of a tension axis, a parallel shear axis, or a perpendicular shear axis.

2. The apparatus of claim 1 further comprising:
an analyzer that performs structural analysis using the transformed finite element model to generate a final output.

3. The apparatus of claim 2, wherein the final output includes a set of final parameters for each joint in a set of joints represented by the set of joint elements and wherein the final output is used to perform at least one of substantiation, certification, or validation of the structure.

4. The apparatus of claim 1, wherein the model transformer comprises:
a node manager that identifies each location in the finite element model that represents a joint of a set of joints as a joint location based on geometry data for the structure.

5. The apparatus of claim 4, wherein the node manager identifies a node pair corresponding to the joint location and classifies an insert node of the node pair as representing an insert portion of the joint and a receiving node of the node pair as representing a receiving portion of the joint based on at least one of the geometry data, a first number of elements in the finite element model associated with the insert node, or a second number of elements in the finite element model associated with the receiving node.

6. The apparatus of claim 4, wherein the joint is one of a mortise and tenon joint, a blind rabbet joint, a blind chai joint, and a parallel-plane insert joint.

7. The apparatus of claim 4, wherein the model transformer further comprises: an element creator that creates a joint element at each joint location identified by the node manager, wherein the joint element is a one-dimensional element.

8. The apparatus of claim 7, wherein the element creator creates a one-dimensional element between an insert node associated with a first surface in the finite element model and a receiving node associated with a second surface in the finite element model, wherein the insert node represents an insert portion of the structure and the receiving node represents a receiving portion of the structure.

9. The apparatus of claim 8, wherein the element creator assigns a local coordinate system to the one-dimensional element that includes an X-axis substantially normal to the second surface, a Y-axis that is a cross-product of the X-axis and a vector that is substantially normal to the first surface, and a Z-axis that is a cross-product of the X-axis and the Y-axis.

10. A method for transforming a finite element model, the method comprising:
creating a set of joint elements to the finite element model of a structure at a set of joint locations in the finite element model; and
generating a transformed finite element model, comprising a consistency and an efficiency improved over a manually computed finite element model, via assigning a local coordinate system to each of the set of joint elements that is independent of a global coordinate system of the finite element model, via assigning a set of force axes to a one-dimensional element, the set of force axes comprising at least one of: a tension axis, a parallel shear axis, or a perpendicular shear axis.

11. The method of claim 10 further comprising:
performing structural analysis using the transformed finite element model to generate a final output.

12. The method of claim 10, wherein creating the set of joint elements comprises:
identifying each location in the finite element model that represents a joint in the structure based on geometry data for the structure to form the set of joint locations.

13. The method of claim 12, wherein creating the set of joint elements further comprises:
identifying a node pair corresponding to each joint location; and
classifying a first node of the node pair as an insert node that represents an insert portion of the joint represented by the each joint location and a second node of the node pair as a receiving node that represents a receiving portion of the joint.

14. The method of claim 13, wherein classifying the first node as the insert node and the second node as the receiving node comprises:
classifying the first node as the insert node and the second node as the receiving node based on at least one of the geometry data, a first number of elements in the finite element model associated with the insert node, a second number of elements in the finite element model associated with the receiving node, a location of the first node along a first surface in the finite element model, or a location of the second node along a second surface in the finite element model.

15. The method of claim 13, wherein creating the set of joint elements further comprises:
creating a one-dimensional element at each of the set of joint locations identified, wherein the one-dimensional element is a joint element.

16. The method of claim 13, wherein creating the set of joint elements further comprises:
creating a one-dimensional element between the insert node and the receiving node, wherein the insert node belongs to a first surface and the receiving node belongs to a second surface.

17. The method of claim 16, wherein assigning the local coordinate system comprises:
creating an X-axis that extends from the one-dimensional element and that is substantially normal to the second surface;
creating a Y-axis that is a cross-product of the X-axis and a vector that is substantially normal to the first surface; and
creating a Z-axis that is a cross-product of the X-axis and the Y-axis.

18. A method for transforming a finite element model of a structure, the method comprising:
identifying a set of joint locations in the finite element model of the structure;
creating a set of joint elements at the set of joint locations in the finite element model; and
generating a transformed finite element model, comprising improved consistency and efficiency as compared to creating at least one of: the set of joint elements manually or manually assigning a local coordinate system for the each of the set of joint elements, via assigning the local coordinate system to each of the set of joint elements that is independent of a global coordinate system of the finite element model, via assigning a set of force axes to a one-dimensional element, wherein the set of force axes comprises at least one of a tension axis, a parallel shear axis, or a perpendicular shear axis.

\* \* \* \* \*